United States Patent [19]
Wu

[11] Patent Number: 5,920,774
[45] Date of Patent: Jul. 6, 1999

[54] METHOD TO FABRICATE SHORT-CHANNEL MOSFETS WITH AN IMPROVEMENT IN ESD RESISTANCE

[75] Inventor: Shye-Lin Wu, Hsinchu, Taiwan

[73] Assignee: Texas Instruments - Acer Incorporate, Hsinchu, Taiwan

[21] Appl. No.: 09/024,772

[22] Filed: Feb. 17, 1998

[51] Int. Cl.$^6$ .................. H01L 21/8238; H01L 21/8249
[52] U.S. Cl. .................. 438/224; 438/234; 438/238
[58] Field of Search .................. 438/203, 207, 438/224, 234, 238

[56] References Cited

U.S. PATENT DOCUMENTS

| | | | |
|---|---|---|---|
| 5,246,872 | 9/1993 | Mortensen | 437/51 |
| 5,262,344 | 11/1993 | Mistry | 437/57 |
| 5,272,097 | 12/1993 | Shiota | 437/44 |
| 5,416,036 | 5/1995 | Hsue | 437/51 |
| 5,529,941 | 6/1996 | Huang | 437/44 |
| 5,571,737 | 11/1996 | Sheu et al. | 437/44 |
| 5,591,661 | 1/1997 | Shiota | 437/56 |
| 5,610,089 | 3/1997 | Iwai et al. | 437/34 |
| 5,618,740 | 4/1997 | Huang | 438/224 |
| 5,652,155 | 7/1997 | Liu et al. | 437/55 |
| 5,663,082 | 9/1997 | Lee | 438/234 |
| 5,712,200 | 1/1998 | Jiang | 438/238 |

OTHER PUBLICATIONS

K.L. Chen "Effects of Interconnect Process and Snapback voltage on the ESD Failure Threshold of NMOS Transistors"—"Shallower junctions and thicker salicide have a negative impact on the ESD capability of a process," Proc. 10th EOS/ESD Symp. (1988) p. 212. Month Unknown.

Amerasekera et al. "Correlating Drain Junction Scaling, Salicide Thickness, and Lateral NPN Behavior, with the ESD/EOS Performance of a 0.25 μm CMOS Process IEDM Tech. Dig. *1996) p. 893," Month Unknown.

C.Y. Chang and S.M. Sze, "ULSI Technology McGraw–Hill Book Co." (1996) p. 270. Month Unknown.

Homma et al. "A Selective SiO$_2$ Film–Formation Technology Using Liquid–Phase Deposition for Fully Planarized Multilevel Interconnections" J.Electrochem. Soc. 140, (1993) p. 2410. Month Unknown.

B.S. Chen et al. "Formation of Cobalt Silicided Shallow Junction Using Implant Into/Through Silicide Technology and Low Temperature Furnace Annealing" IEEE Trans. Electron Devices, ED–43, (1996) p. 258. Month Unknown.

Primary Examiner—John F. Niebling
Assistant Examiner—Michael S. Lebendritt
Attorney, Agent, or Firm—Harness, Dickey & Pierce, P.L.C.

[57] ABSTRACT

A method to fabricate simultaneously a MOS transistor and an ESD protective transistor in a silicon substrate is disclosed. The ESD protective devices are fabricated by using double diffused drain (DDD) ion implantation technology. In the functional region, MOSFETs structure are ion implanted by utilizing a large angle pocket antipunchthrough, succeeded using a lightly doped drain implantation technology with a liquid phase deposition (LPD) oxide layer in the ESD protective region as a mask. Next, a first thermal process is applied to form self-aligned silicide contacts. A low energy, high dose ion implantation implanted into silicide is then carried out, which is used as a diffusion source for forming an ultra-shallow junction. After that, a second rapid thermal process (RTP) is employed, an ultra-shallow junction, and low-resistivity stable phase of self-aligned silicide contacts in the functional region and a double diffusion junction in the ESD protective region are formed simultaneously.

14 Claims, 5 Drawing Sheets

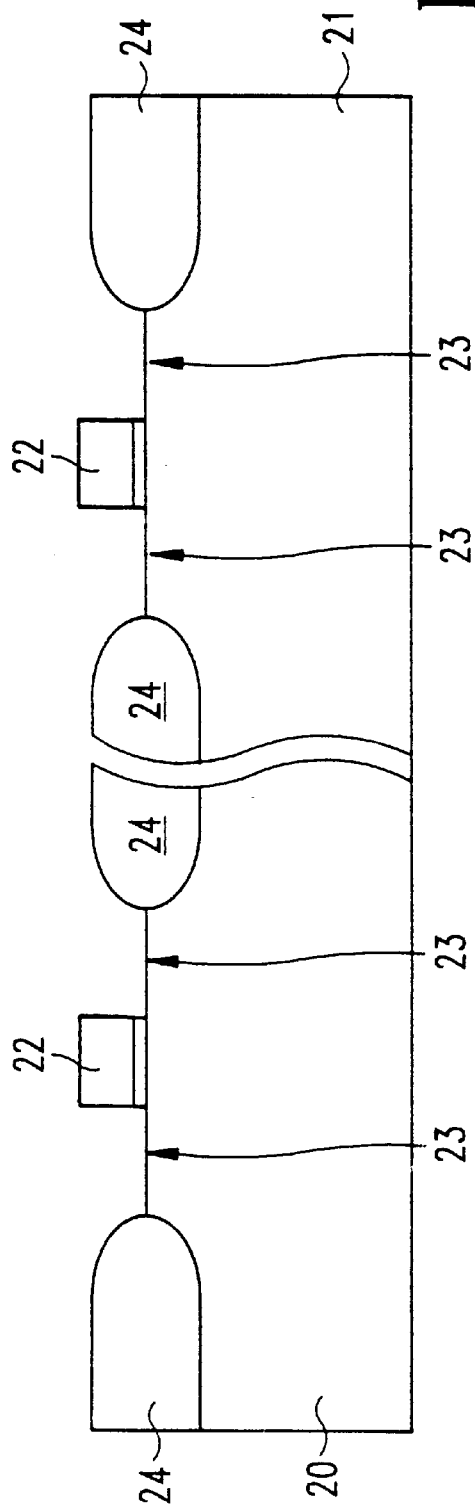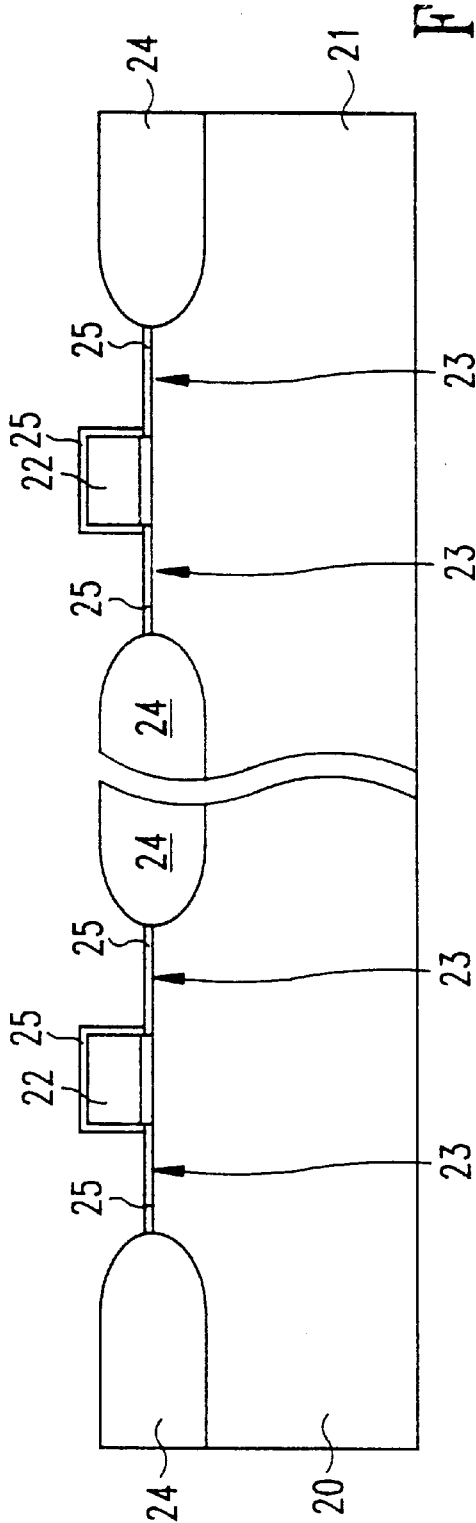

METHOD TO FABRICATE SHORT-CHANNEL MOSFETS WITH AN IMPROVEMENT IN ESD RESISTANCE

FIELD OF THE INVENTION

The present invention pertains to a semiconductor device process, and, more specifically, to a method of fabricating short-channel MOSFETs with an improvement in ESD resistance.

BACKGROUND OF THE INVENTION

In the 1990s, the beginning of the ULSI era, the most important factor achieving the ULSI complexity has been the continued reduction of the minimum device-feature length (gate, source and drain regions in MOS devices). The reduction in feature length and related dimensions has resulted in promoting the rapid growth in the number of components per MOSFET chip (the unit cost per function reduction) and improving of device speed (which varies inversely approximately with the square of feature length).

However, as a device is scaled from one micron down to the submicron size or beyond, it may suffer more stringent problems. For example, hot carriers effect and punchthrough effect are two of the major constraints in CMOS transistor scaling. Further, parasitic resistance and capacitance in the scaled device structure must be avoided.

Another limiting factor for devices with submicron dimensions is the conductivity of the source/drain regions and the poly-gate. For example, the sheet resistance of diffusion regions increases from 25 $\Omega$/sq—in a 1 $\mu$m technology to 50 $\Omega$ sq—in a 0.5 $\mu$m technology. A self-aligned silicide technology, namely salicide, has been developed which involves the formation of silicide on poly-silicon gate, source and drain contact simultaneously. The salicide process can provide not only low-sheet resistance for S/D regions and for gate electrodes in MOS devices but also a very clean silicide-silicon interface. Further, it does not require any additional lithography and etching. In addition, the alignment was predetermined.

Another critical issue accompanying the feature size of MOSFET scale down and degrading significantly the device performance is the electrostatic discharge (ESD). The ESD may be easily conducted through the input/output and power lead connections into the internal devices to destroy the devices. For example, a high voltage can be accidentally applied to the pins of the IC package by a person while handling, causing the breakdown of the gate oxide of the devices. Thus, it is imperative that a built-in protective ESD circuitry be formed simultaneously with the functional transistors.

However, silicided S/D regions and the LDD structures can degrade the ESD performance of the gate-controlled breakdown structure. As a result, the ESD protection structures can be rendered largely ineffective by the silicided process. Chen proposed that "Shallower junctions and thicker salicide have a negative impact on the ESD capability of a process," in an article appearing at page 212 of the Proceedings of the 10$^{th}$ EOS/ESD Symposium (1988).

In an article appearing at page 893 of the IEDM Technical Digest (1996), Amerasekera et al. investigated the relationship between the current gain $\beta$ of a self-biased lateral NPN (parasitic bipolar in a NMOS) transistor and the ESD performance, and found that devices with lower $\beta$ are observed to have lower ESD performance. Further, the authors also suggested that $\beta$ is found to be strongly influenced by the effective drain/source diffusion depth below the salicide which is determined by the implant energy as well as by the amount of active diffusion consumed in silicidation. Thus, it is essential to develop a salicide process with an ESD preventive circuitry and the ULSI devices being fabricated at the same time giving the least influence on ESD performance.

On the other hand, as linewidths are narrowed to submicron size, the lithography also becomes a limiting factor. For example, decreasing the wavelength ($\lambda$) of the optical source and increasing numerical aperture (NA) are logical approaches to improve resolution. However, they decrease the depth of focus (DOF). See the equation given in the reference by C. Y. Chang and S. M. Sze, "ULSI technology," (McGraw-Hill Book Co. (1996) p. 270):

$$DOF=\pm\lambda/2(NA)^2$$

The DOF corresponds to the height of the largest window or equivalently to the height of photoresist. It is, therefore, essential to decrease the number of lithography or to find an effective mask formed at a lower temperature with minimum thickness that can block the unwanted icons during implanting. A liquid phase deposition (LPD) oxide layer is one of the best candidates that can satisfy such conditions.

The LPD technology as suggested by Homma, et al., in J. Electrochem. Soc. 140, (1993) p. 2410, utilizes supersaturated hydrofluosilicic acid and $H_2SiF_6$ aqueous as a source liquid. The LPD-$SiO_2$ layers can be selectively formed on chemical vapor deposition (CVD) $SiO_2$ underlayers in the trenches between photoresist patterns or tungsten wiring with photoresist as a mask without destroying the photoresist. Besides, the lower reaction temperature is required for forming LPD-$SiO_2$ layers. Other benefits obtained from the LPD-$SiO_2$ layers include the fact that it can more effectively prevent the ion penetrated through the oxide layer than through the photoresist during ion implantation. Thus, no additional mask is needed.

SUMMARY OF THE INVENTION

The present invention discloses a method for fabricating a MOS transistor and an ESD protective transistor in a silicon substrate formed simultaneously. The method comprises the steps of: (1) Forming a silicon oxynitride layer in $N_2O$ and NO ambient on both the poly-silicon gate structure and the silicon substrate of the functional region and the ESD protection region; (2) Patterning the functional region with the photoresist by using a lithography technology; (3) Co-implanting two kinds of ion species, As$^+$ and P$^+$, in the silicon substrate of the ESD protection region by utilizing a photoresist on the functional region as a mask; (4) Forming a liquid phase deposited (LPD) oxide layer on the ESD region; (5) Removing the photoresist of the functional region, and performing p$^+$ ions-pocket antipunchthrough implantation in a region for defining source/drain in the functional region, and performing LDD ion implantation on the source/drain region to form a n region beneath the gate structure; (6) Forming a sidewall spacer oxide layer on the sidewall of the gate of the functional region, CVD or sputtering a metal layer on the functional region and the ESD protection region; (7) Performing a first thermal annealing to form a silicide layer on the source/drain and polycide on the poly-Si of the function region; (8) Etching any unreacted metal; (9) Performing CVD of a thick oxide layer on the top of the functional region and the ESD protection region As$^+$ ions are implanted into the functional region; and (10) Applying a second rapid thermal annealing.

After that, self-aligned silicide contacts with ultra-shallow junctions of short-channel nMOSFETs in the functional region and ESD transistors with double diffusion junctions are formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a silicon substrate with a gate structure on both the functional region and the ESD protection region according to the prior art;

FIG. 2 is a cross-sectional view of a silicon substrate with silicon oxy-nitride on the gate structure according to the present invention;

DETAILED DESCRIPTION OF THE PREFERRED EMBODIMENT

Figure 3:
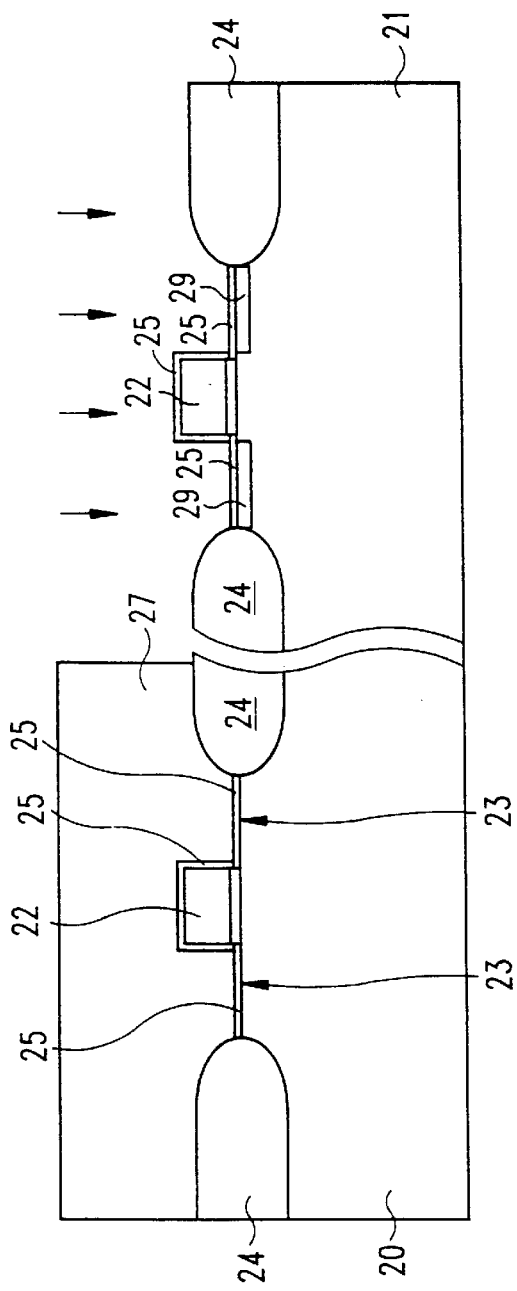
FIG. 3 is a cross-sectional view of the functional region capped with photoresist, with As$^+$ and P$^+$ co-implanted into the ESD protection region according to the present invention.

A method from which self-aligned silicided short-channel MOSFETs are formed simultaneously with an improvement in the ESD protection structure is provided in the present invention. The detailed processes will be described as follows.

FIG. 1 shows a cross-sectional view of two distinctive regions, a functional region 20 and an ESD protection region 21. Each region, with at least one defined poly-Si/oxide gate structure 22, is formed for defining source/drain 23 (the positions are indicated by an arrow) on regions of a <001> orientation boron doped single crystal silicon substrate. An isolation region 24 isolates source/drain regions of the functional region 20 and the ESD protection region 21. The ESD protection region 21 can be far away from or adjacent to the functional region 20 but is isolated by an isolation region 24. The method for patterning the poly-silicon gate structure 22 on regions 23, and forming isolation regions 24 is known in the art, therefore, no details are given.

FIG. 2 shows an insulating layer, preferably an oxynitride layer 25 formed on the surface of the source/drain regions 23 and the poly-gate structure 22 of the substrate annealed in N$_2$O and/or NO ambient according to the method of the present invention. An oxynitride layer 25 is formed, and the etching damage (during plasma etching) will be recovered simultaneously.

Referring to FIG. 3, a photoresist 27 is masked via a lithography process on all areas of the functional region 20, and two ion species selected from the group of arsenic, antimony and phosphorus ions are co-implanted into the ESD region 21 for forming a double diffused drain junction 29. The energy and the dosage for As$^+$ (P$^+$) ion implantation are about 5 keV to 150 keV and $5\times10^{14}/cm^2$ to $5\times10^{16}/cm^2$, respectively.

Figure 4:
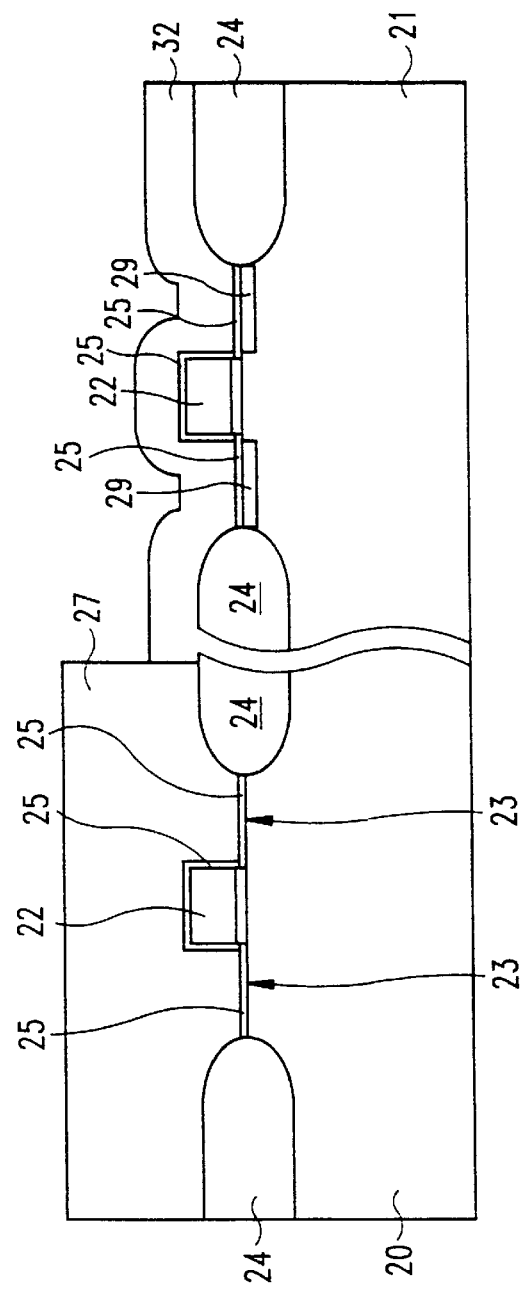
FIG. 4 is a cross-sectional view of forming a LPD oxide on the ESD protection region according to the present invention.

Next, a liquid phase deposition (LPD) oxide 32 overlay is grown on all areas of the ESD protection region 21. The LPD oxidation is conducted at a temperature of about 25° C. to 300° C., to a thickness of about 50 nm to 300 nm as shown in FIG. 4. It is noteworthy that the LDP oxide will, thereafter, serve as an effective mask in the following steps of fabricating the functional region 20.

Figure 5:
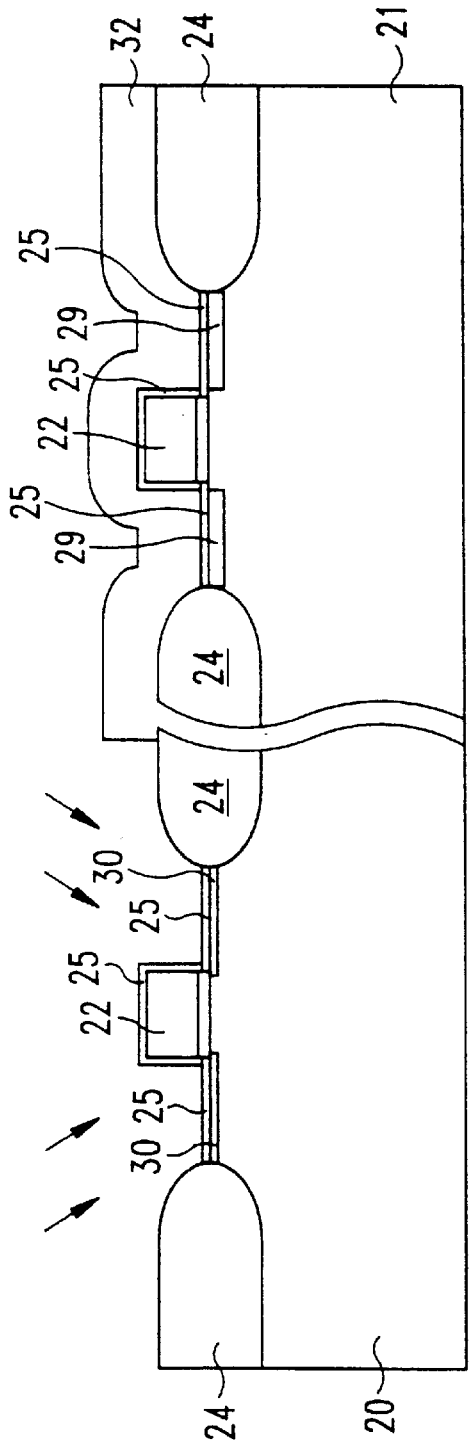
FIG. 5 is a cross-sectional view of performing a pocket antipunchthrough ion implantation according to the present invention.

Referring to FIG. 5, the photoresist 27 on the surface of the functional region is removed. Subsequently, the large angle titled pocked anti-punchthrough BF$_2^+$ implanted (in the directions indicated by the arrows) is provided to form p regions 30. Preferably, the conditions of the implantation are carried out by an energy of about 20–120 keV, to a dose of about $5\times10^{11}$–$1\times10^{13}/cm^2$, and with a tilt angle of about 10–60°.

Figure 6:
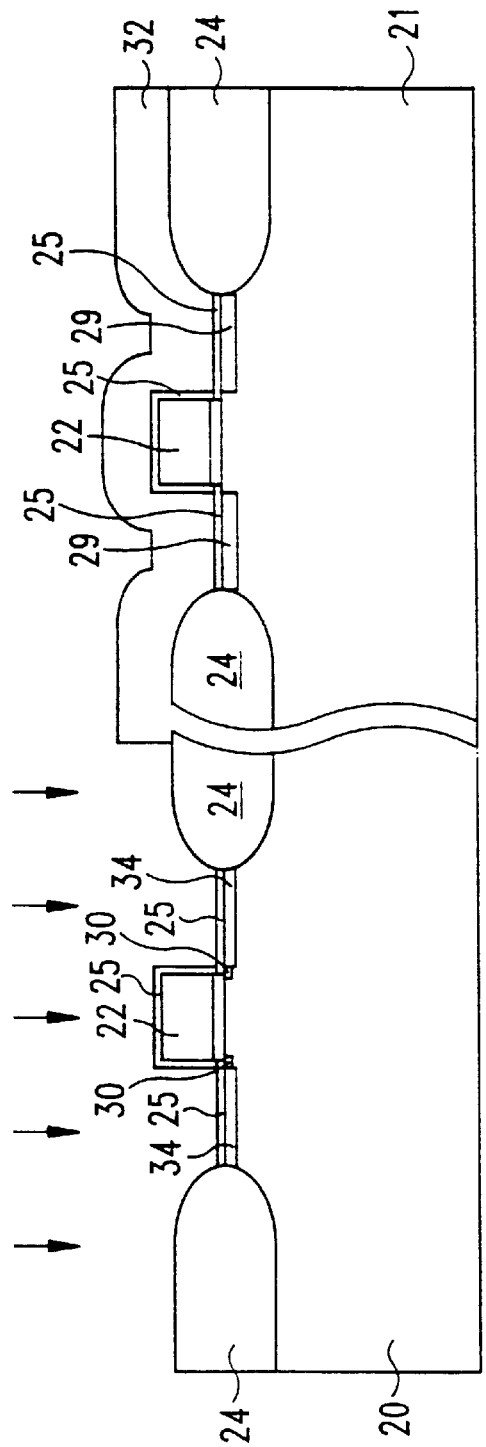
FIG. 6 is a cross-sectional view of performing a LDD ion implantation on the top of the functional region by utilizing the LPD oxide as a mask according to the present invention.

As shown in FIG. 6, a hot carrier suppression, lightly doped drain (LDD) As$^+$ or P$^+$ ion implantation is then implanted into the whole area of the functional region 20 to form a n region 34. The conditions of implantation energy are about 5 keV to 100 keV, to a dose of about $5\times10^{12}$–$1\times10^{14}/cm^2$.

Figure 7:
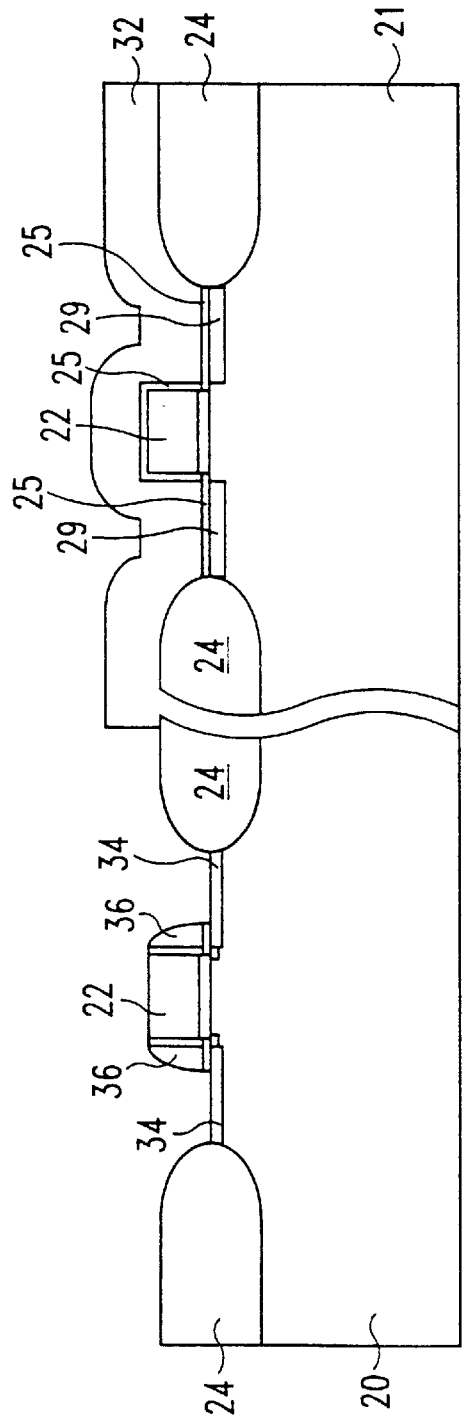
FIG. 7 is a cross-sectional view of forming a silicon dioxide layer on the surface of the functional region by a first-step thermal annealing, then etching back to form a sidewall oxide spacer on the functional region according to the present invention.
Figure 8:
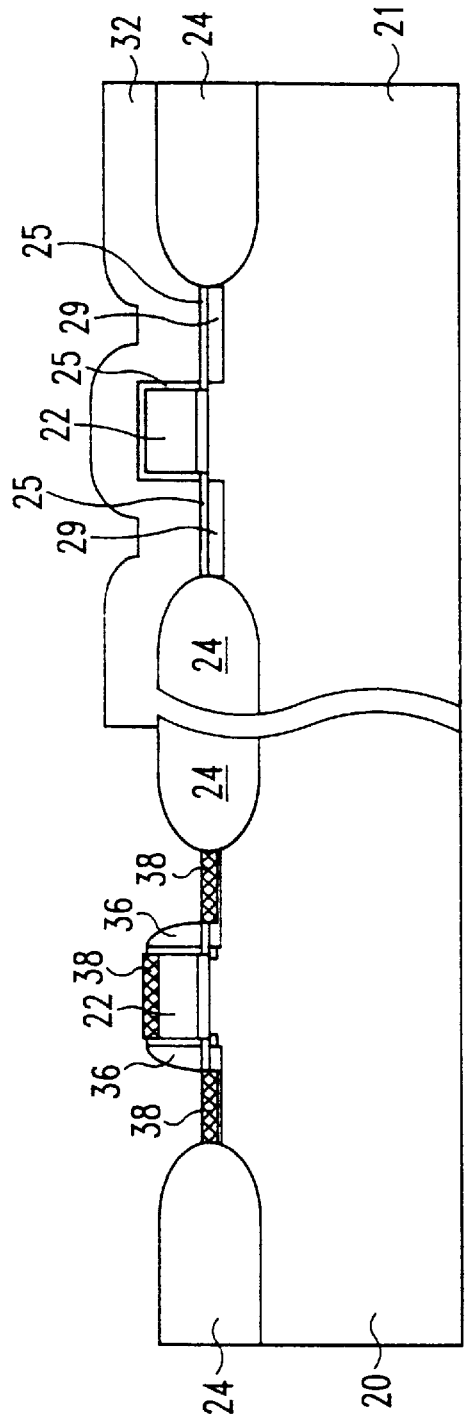
FIG. 8 is a cross-sectional view of forming self-aligned silicide layers according to the present invention.

Next referring to FIG. 7, an oxide layer (not shown) is deposited over the isolation regions 24, the poly-Si gate and the substrate of the functional region 20 by CVD deposition with a thickness of about 50 nm to 200 nm. Next, an anisotropic etching is performed on the oxide layer to form an oxide sidewall spacer structure 36 on the sidewalls of the gate. In order to form a salicided contact, a metal layer (not shown) selected from the group of Ti, Co, Ni, and W is deposited on all areas. The method of deposition can be carried out by either a CVD or a sputtering process and generally with 10 nm to 100 nm in thickness. Then, the first step of silicidation process at a lower temperature is implemented. As shown in FIG. 8, the metal layer reacts with the poly-Si on the gate structure 22, and then a self-aligned gate silicide layer 38 is formed on the top surface of the poly-gate 22. At the same time, a silicide layer 38 is also formed on the source/drain regions 23 by consuming a layer of silicon substrate. Preferably, a rapid thermal process (RTP) is done at a temperature of about 350° C. to 750° C. in nitrogen ambient. Some of the unreacted metal layers (on the isolation region, the spacer and the LPD oxide) are then selectively removed through the use of an etchant that does not attack the silicide, the silicon substrate, or the SiO$_2$. Preferably, the removal of the unreacted metal layers can be done by a wet etching using a solution containing NH$_4$OH, H$_2$O and H$_2$O$_2$.

Figure 9:
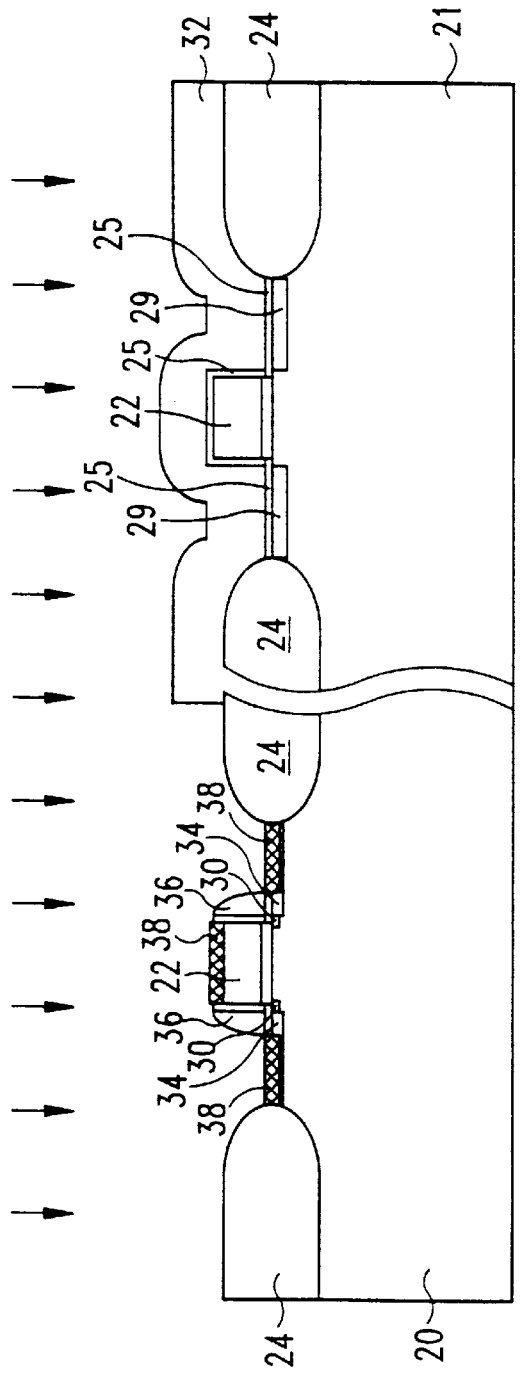
FIG. 9 is a cross-sectional view of performing arsenic ion implantation according to the present invention.

Referring to FIG. 9, a high dose, low energy arsenic or phosphorus ions (arsenic is generally preferred) is selected and implanted into/through the silicide layers 38 on the top of the gate 22 and the source/drain regions 23. Preferably, an energy of about 5 keV to 100 keV to a dose of about $5\times10^{14}/cm^2$ to $5\times10^{16}/cm^2$ of the ion implantation is performed. For heavy mass of arsenic ions and the lower implanted energy, the spacer oxide and isolation oxide provide an effective mask, and obstruct the ions into such regions.

Figure 10:
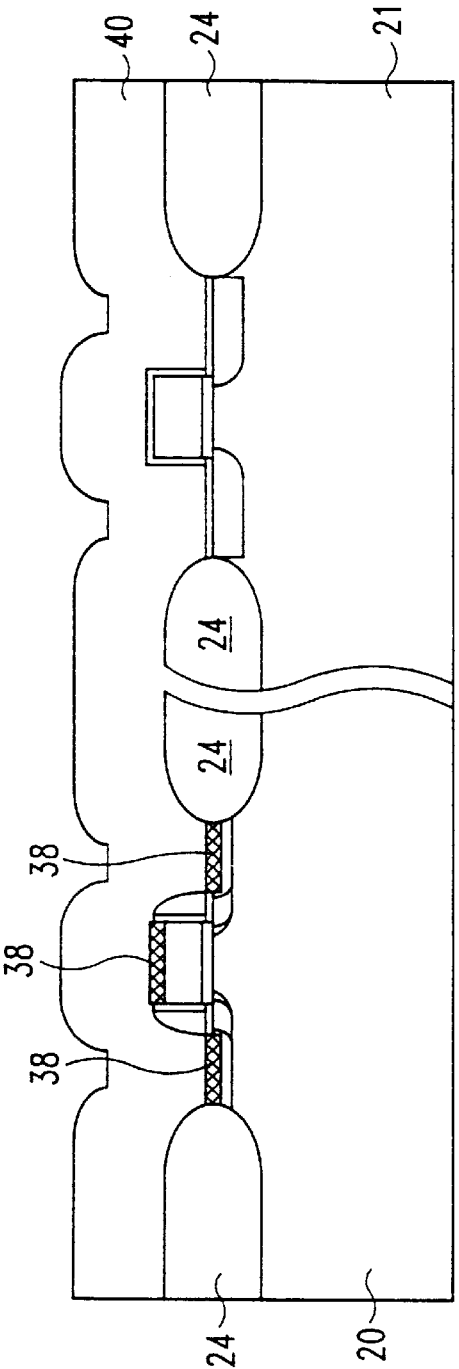
FIG. 10 is a cross-sectional view of forming a thick CVD oxide on the top surface of the functional region and the ESD protection region, then a second-step RTP process is performed, an ultra-shallow junction and a double diffusion drain junction are formed in the functional region and the ESD protection region, respectively, according to the present invention.

As shown in FIG. 10, a thick and continuous CVD oxide layer 40 is deposited on the top surface of the functional region and the ESD protection regions. Preferably, the thickness of the oxide layer is about 100–800 nm in thickness at a temperature of about 500–800° C. Next, a second-step thermal process at high temperature is implemented. The doping impurities in silicide layers will serve as a diffusion source, and be driven into the substrate and the poly-Si gate 22, such that an ultra-shallow source/drain 23 junction is formed. The junction depth of the source/drain is determined by the redistribution of impurity ions, i.e., the thermal process. Further, silicide formed at first step annealing will transform to a stable phase and lower the sheet resistance. Taking TiSi2 silicides as an example, the first RTP is done at 580–680° C. and a second RTP is done at a temperature higher than 750° C. The second RTP transforms the meatball C-49 $TiSi_2$ to the low-resistivity C-54 $TiSi_2$ (orthogonal phase). At the same time, the DDD junction is formed in the ESD protection region 21. Furthermore, the impurity ions in the substrate and the poly-Si gate 22 will be activated, and the damages caused by ion implantation will be recovered after the aforementioned thermal process. In a preferred embodiment, a second step of RTP is performed at a temperature of about 700° C. to 1150° C. for 5 s to 180 s.

The benefits of this invention include: (1) Ultra-shallow junctions with self-aligned silicided contacts in the function devices could be obtained by using the silicide layers as a diffusion source (see the reference by B. S. Chen et al. appearing at page 258 of IEEE Trans. Electron Devices, ED-43, (1996)); (2) the circuit operation speed and the short channel effect in the functional devices could be significantly improved; and (3) the high ESD protection voltage could be obtained by using the double drain (DDD) junction (please see the reference by K. L. Chen appearing at page 212 of the Symp. EOS/ESD proceeding, (1988)).

As is understood by a person skilled in the art, the foregoing preferred embodiment of the present invention is an illustration of the present invention rather than a limitation thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, in the method, we proposed that for fabricating short-channel nMOSFETs (for nMOSFETs, $As^+$ ion implantation is used to form $n^+p$ junction) with self-aligned contact and with improved ESD resistance can also be used in fabricating pMOSFETs. (For pMOSFETs, $BF_2^+$ ion implantation is generally used to form a $p^+n$ junction.)

What is claimed is:

1. A method for fabricating a MOS transistor and an ESD protective transistor in a silicon substrate, said method comprising the steps of:

forming an isolation region in said silicon substrate, said isolation region separating said silicon substrate into a functional region having a plurality of MOS transistors and said ESD region having one transistor;

forming a first insulating layer on said functional region and said ESD protection region;

forming a poly-silicon layer on said first insulating layer of said functional region and said ESD protection region;

patterning said poly-silicon layer to form a gate structure on both said functional region and said ESD protection region;

forming a second insulating layer on said poly-silicon gate structure and on said silicon substrate of said functional region and said ESD protection region;

masking said functional region by utilizing a photoresist;

performing a first ion implantation of two kinds of the same type of ion species into said silicon substrate of said ESD protection region by utilizing said photoresist as a mask;

forming a third insulating layer on said second thin insulating layer of said ESD region by utilizing said photoresist on said functional region as said mask;

removing said photoresist on said functional region;

performing a pocket antipunchthrough ion implantation implanted into a region for defining a source/drain in said functional region by utilizing said third insulating layer and said isolation region as said mask;

performing a LDD ion implantation on said source/drain region by utilizing said third insulating layer and said isolation region as said mask;

forming a fourth insulating layer on said functional region and said ESD protection region;

performing an anisotropic etching process on said fourth insulating layer to form oxide spacers on sidewalls of said gate in said functional region;

forming a metal layer on said functional region and said ESD protection region;

performing a first step of thermal annealing said substrate to form a silicide layer on said source/drain and said poly-silicon gate of said functional region;

etching unreacted metal on said oxide spacers and said isolation regions in said functional region and said third insulating layer of said ESD protection region;

forming source/drain regions by ion implantation into said silicide of said functional region using said third insulating layer and said isolation region as a mask;

forming a continuous insulating layer on top of said functional region and said ESD protection region; and performing a second step of thermal annealing said substrate to form ultra-shallow junctions in said functional region and a DDD junction in said ESD protection region.

2. The method of claim 1, wherein said first insulating layer is a silicon dioxide.

3. The method of claim 1, wherein said second insulating layer is an oxynitride layer.

4. The method of claim 1, wherein said two kind of ion species are selected from a group consisting of arsenic, phosphorus and antimony for n-type ion species.

5. The method of claim 1, wherein said third insulating layer is formed by a method of liquid phase oxide deposited technology.

6. The method of claim 5, wherein said third insulating layer is formed at a temperature of about 25° C. to 300° C. and to a thickness of about 500 to 3000 angstroms.

7. The method of claim 1, wherein said pocket antipunch-through ion implantation comprises an ion which is selected from the group consisting of boron and $BF_2^+$.

8. The method of claim 7, wherein said pocket antipunch-through implantation has an implantation energy of about 20–120 keV, a dose of about $5\times10^{11}/cm^2$–$5\times10^{14}/cm^2$ and a tilt angle of about 10–60°.

9. The method of claim 1, wherein said LDD implantation uses an energy of about 5 keV to 100 keV and a dose of about $5\times10^{12}/cm^2$ to $1\times10^{14}/cm^2$.

10. The method of claim 1, wherein said metal layer comprises a metal selected from the group consisting of Ti, Co, Ni and W.

11. The method of claim 1, wherein said first step of thermal annealing to form a silicide layer is performed by a RTP process at a temperature of about 350° C. to 700° C. in nitrogen ambient.

12. The method of claim 1, wherein said source/drain regions ion implantation is carried out by using $As^+$ as an ion species.

13. The method of claim 1, wherein said forming a continuous insulating layer is formed to a thickness of about 100 nm to 800 nm and at a temperature of about 500° C. to 800° C.

14. The method of claim 1, wherein said second step of thermal annealing is performed by a RTP process at a temperature of about 700° C. to 1150° C. in nitrogen ambient.

* * * * *